United States Patent [19]

Roberson

[11] 3,913,124

[45] Oct. 14, 1975

[54] INTEGRATED SEMICONDUCTOR TRANSISTOR STRUCTURE WITH EPITAXIAL CONTACT TO THE BURIED SUB-COLLECTOR INCLUDING FABRICATION METHOD THEREFOR

[75] Inventor: Donald K. Roberson, Scottsdale, Ariz.

[73] Assignee: Motorola, Inc., Chicago, Ill.

[22] Filed: Jan. 3, 1974

[21] Appl. No.: 430,434

[52] U.S. Cl. ........................ 357/40; 357/34; 357/50; 357/55; 357/59; 148/175

[51] Int. Cl.² ........................ H01L 27/02

[58] Field of Search..... 317/235 F, 235 AZ; 357/34, 357/40, 49, 50, 55, 59

[56] References Cited

UNITED STATES PATENTS

| | | | |
|---|---|---|---|
| 3,354,360 | 11/1967 | Campagna et al. | 317/234 |
| 3,386,865 | 6/1968 | Doo | 317/235 UX |
| 3,471,922 | 10/1969 | Legat et al. | 317/235 X |
| 3,500,139 | 3/1970 | Frouin et al. | 317/235 |
| 3,768,150 | 10/1973 | Sloan et al. | 317/235 UX |
| 3,787,252 | 1/1974 | Filippazzi et al. | 317/235 R X |
| 3,791,882 | 2/1974 | Ogiue | 357/59 |
| 3,796,613 | 3/1974 | Magdo et al. | 317/235 R X |
| 3,858,237 | 12/1974 | Sawazaki et al. | 357/49 |

*Primary Examiner*—Andrew J. James
*Assistant Examiner*—Joseph E. Clawson, Jr.
*Attorney, Agent, or Firm*—Vincent J. Rauner; Willis E. Higgins

[57] ABSTRACT

This disclosure is directed to an improved integrated semiconductor transistor device which has the feature of a heavily doped epitaxial semiconductor region in contact with a buried sub-collector region. Additional features include dielectric sidewall isolation combined with PN junction isolation between the substrate and the collector portion of the transistor. The epitaxial contact to the buried sub-collector region is formed simultaneous with the formation of polycrystalline silicon filler material that fills in the dielectric isolation moat or channel located around the sides of individual electrically isolated transistor devices in order to achieve a planar surface structure. Another feature of the transistor device is the use of a base region that extends completely across and in contact with the sidewalls of the dielectric isolation moat. Preferably, the emitter region also extends across and in contact with three of the four of the sidewalls of the dielectric isolation moat. In this manner, transistor devices can be made very small with external electrical metal contacts made to the emitter region, the base region, and to the heavily doped epitaxial semiconductor region that is in contact with the buried sub-collector region. This epitaxial contact region to the buried sub-collector region is located within a portion of the polycrystalline silicon filler material that is bounded by the dielectric isolation sidewall material.

8 Claims, 2 Drawing Figures

INTEGRATED SEMICONDUCTOR TRANSISTOR STRUCTURE WITH EPITAXIAL CONTACT TO THE BURIED SUB-COLLECTOR INCLUDING FABRICATION METHOD THEREFOR

BACKGROUND OF THE INVENTION

1. Field of the Invention

This invention relates generally to improved integrated semiconductor structures including fabrication methods therefor, and, more particularly, to improved integrated semiconductor transistor structures having dielectric sidewall isolation and PN junction substrate isolation including fabrication methods therefor.

2. Background of the Prior Art

Related References

U.S. Pat. No. 3,617,822, 3,648,128, 3,617,826, 3,659,160, 3,736,193.

In the past, integrated semiconductor structures were fabricated using PN junction isolation in order to electrically isolate various transistor or other devices (diodes, resistors, etc.) from each other. The PN junction isolated devices usually had a substrate of one type conductivity and the collector of the transistor device, for example, having a region of opposite type conductivity was located on the substrate and biased with respect to the substrate in a manner to utilize the PN junction between the substrate and the collector of the device for the purpose of electrically isolating the device from the substrate.

Other techniques were developed for isolating devices in an integrated semiconductor structure. One of these techniques included the concept of dielectric isolation. In this technique of isolation, the various semiconductor devices were formed in pockets of monocrystalline semiconductor material which pockets were isolated from an underlying substrate by means of a dielectric layer of material, usually of silicon dioxide. The dielectric isolated semiconductor devices had a very big advantage over PN junction isolated devices in that there was no need to use reverse biased techniques to set up the PN junction isolation and also there was no fear of the possible breakdown of the PN junction.

Subsequently, PN junction isolated structures were developed using dielectric isolated sidewall regions in combination to provide integrated semiconductor structures using the methods of both isolation techniques. One primary advantage attributed to the PN junction isolated structure over the dielectric isolated substrate concept is that the PN junction substrate isolated device can be generally made more simpler (less fabrication steps) and more planar than the more complex dielectric substrate isolated type of structure.

One recently developed technique used in the combination of PN junction and dielectric isolated structures produced the "VIP" semiconductor integrated structure wherein a V-shaped moat which was formed around the individual transistor devices was subsequently filled by means of a V-shaped silicon dioxide isolation layer followed by a filled in polycrystalline semiconductor material which thereby formed the VIP isolation channel. The V stands for the shape of the moat, the I stands for isolation formed by the dielectric material, and the P stands for the polycrystalline silicon used to fill in the moat and thereby make the structure substantially planar.

A need existed to develop an improved version of the VIP integrated semiconductor structure which would have the following features:

1 A good low resistance contact to the buried sub-collector region of the transistor device.
2 Very small device geometries thereby conserving important silicon real estate on the chip.
3 Only dielectric sidewall isolation and PN junction isolation between the substrate and the device.

SUMMARY OF THE INVENTION

Accordingly, it is an object of this invention to provide an improved integrated semiconductor structure.

It is another object of this invention to provide a process for making an integrated semiconductor structure.

It is still another object of this invention to provide an improved semiconductor structure using PN junction isolated substrates and dielectric sidewall isolation, in combination.

It is a still further object of this invention to provide a method for producing an improved integrated semiconductor structure using PN junction substrate isolation and dielectric sidewall isolation.

It is a still further object of this invention to provide an improved semiconductor structure using a VIP isolation moat around semiconductor devices and having good low resistance contacts to the buried sub-collector regions of the transistor devices.

DESCRIPTION OF THE SPECIFICATION

Figure 1:
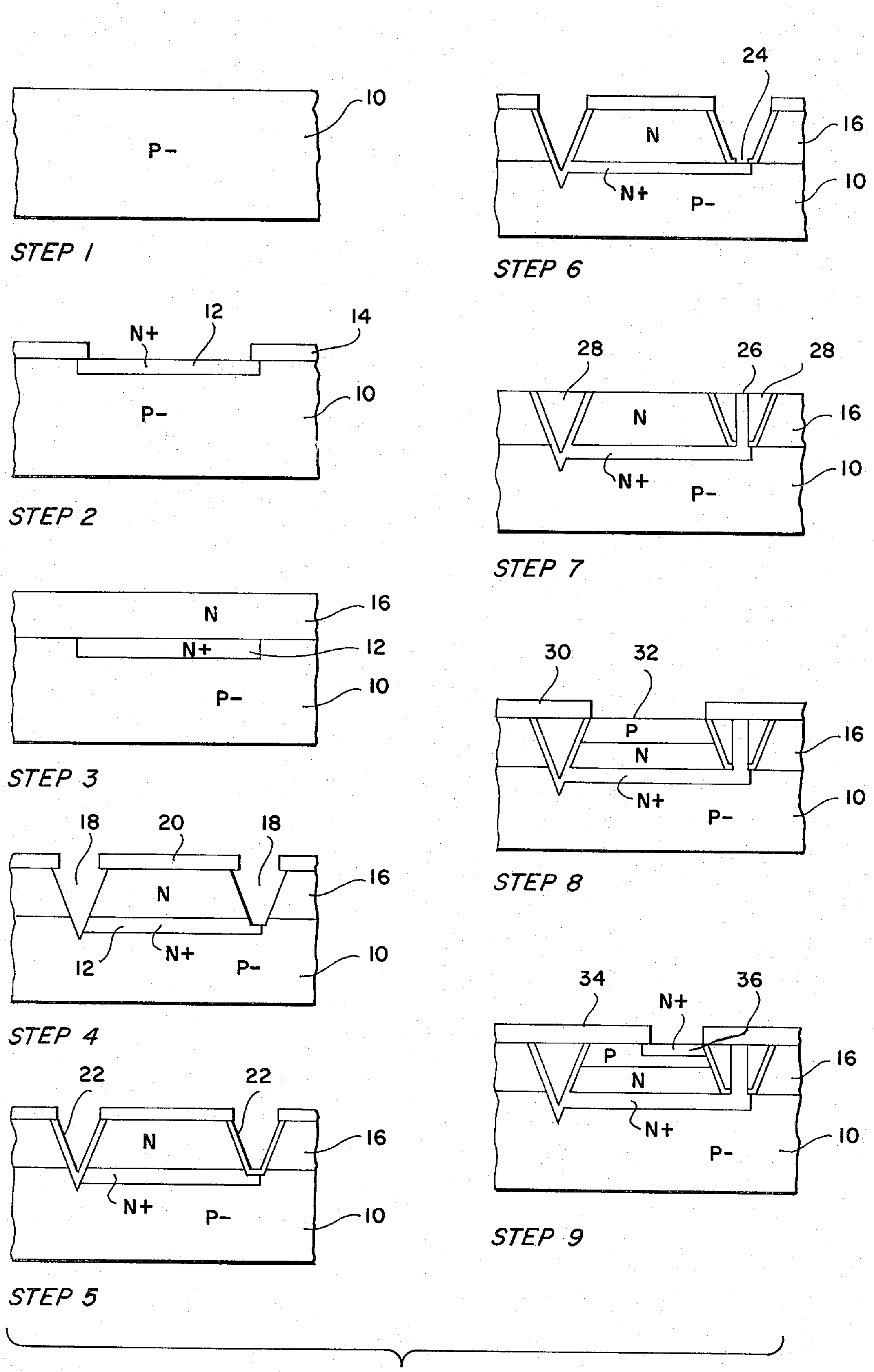
FIG. 1 illustrates in nine steps elevational sectional views illustrating the fabrication process for producing the integrated semiconductor structure of this invention.

Referring to FIG. 1, step 1 depicts an elevational sectional view of a substrate 10 of P- type conductivity. Preferably, the substrate 10 is fabricated using conventional crystal pulling techniques to form a P doped monocrystalline semiconductor rod which is then sliced into wafers to provide the starting substrate 10 which is a wafer doped preferably with boron or other P type dopants.

In step 2, an N+ sub-collector region 12 is preferably diffused into the P— substrate 10 using conventional masking and diffusion techniques with a masking layer 14 preferably of silicon dioxide. The sub-collector region 12 has an impurity concentration of about $10^{20}$–$10^{21}$ impurities per cubic centimeter. Particularly suitable as the impurity for the sub-collector region 12 is arsenic which is an N type dopant. The sub-collector region 12 subsequently serves as a low resistance, high conductivity region for moving electrons rapidly out of the collector area of the transistor. The P— substrate has an impurity concentration of about $10^{17}$ impurities per cubic centimeter and is preferably doped with a P type dopant such as boron. The thickness of the masking layer 14 is preferably about 5000 Angstroms.

In step 3, the masking layer 14 is removed after the formation of the N+ sub-collector region 12 and an epitaxial layer 16 of N type conductivity is formed on the substrate 10. N type layer 16 has an impurity concentration of about $10^{18}$ impurities per cubic centimeter and is preferably doped with either arsenic or phosphorous which are both of N type conductivity.

In step 4, an anisotropic etching operation is carried out to form a channel or moat 18 around a central portion containing monocrystalline semiconductor material of N type conductivity. This is achieved by using a masking dielectric layer 20 preferably of silicon dioxide which has the moat shaped opening formed in the layer 20 by means of photolithographic masking and etching techniques. Since the initial starting wafer 10 preferably has a 100 crystallographic orientation, an etch is selected in the etching step of step 4 to etch preferentially faster in the 100 direction than the 111 direction which is the crystallographic orientation of the sidewalls of the moat. Thereby, the substantially V-shaped configuration of the moat as shown in step 4 is achieved using the anisotropic etching approach. As can be seen by viewing step 4, the moat 18 is wider at one end. The drawing, for the purpose of better illustration, shows the depth of the moat on the left-hand portion of figures of steps 4–9 to be not as deep as the depth of the moat on the right-hand portion. In actual practice, both moats will have the same approximate depth which will be slightly below the PN junction line between the P− substrate 10 and the N collector region 16. The reason for this particular etching configuration is more fully described below.

In step 5, a silicon dioxide or silicon nitride or other form of dielectric material layer is deposited into the moat that was formed in step 4. This dielectric material subsequently serves as the sidewall isolation for the central monocrystalline silicon N type region 16. It should be understood that although the embodiment shown is that of an NPN integrated transistor structure, it is also possible to practice the method of this invention for fabricating a PNP transistor structure wherein all of the conductivity type shown in the drawings would be reversed. Additionally, if desired, the disclosed process could also be applied to an integrated semiconductor structure utilizing the substrate as a sub-collector region for various discrete devices.

In step 6, an opening 24 is formed in the bottom portion of the silicon dioxide layer 22 shown on the right-hand side of the figure. The opening 24 is located in order to permit epitaxial material to be grown on the N+ region 12. The opening 24 is made using conventional photolithographic masking and etching techniques with a photoresist serving as the etch resistant mask to protect areas of the silicon dioxide layer 22 that are not to be etched away.

In step 7, a silicon growth process is carried out which simultaneously forms the N+ epi region 26 and the polycrystalline regions 28 in the moat. This silicon growth process uses a high concentration of N type dopants such as phosphorous or arsenic and because of the opening 24 that was formed in the silicon dioxide masking layer 22, the N+ epitaxial region 26 is formed as an extension of the single crystal N+ sub-collector region 12. As can be seen from viewing step 7, the N+ epitaxial region 26 extends to the surface of the semiconductor structure and subsequently serves as a low resistance contact to the sub-collector region 12. Preferably, the dopants in the silicon growth process to form the epitaxial region 26 and the polycrystalline region 28 have an impurity concentration of about $10^{21}$ impurities per cubic centimeter. The key step in this process is in step 7 where the N+ epitaxial region 26 is formed simultaneously with the N+ polycrystalline region 28 thereby serving to planarize the surface of the integrated structure shown in step 7. Previous techniques using diffusion operations to achieve a low resistance contact to a sub-collector region were not particularly desirable because of the difficulty in achieving a continuous, uniform, low resistant contact to the sub-collector region due to the graded natural weakness of diffusion operations which result in higher concentrations near the surface of the semiconductor structure with lower concentrations (high resistance) being closer to the buried sub-collector region.

In step 8, an oxide masking layer 30 is formed on the surface of the integrated semiconductor structure and is used as a masking layer for the formation of a P type region 32 in the N type collector region 16. The P type region 32 subsequently serves as the base region of the transistor device. Preferably, the P type base region 32 extends across and into contact with the side dielectric material 22 thereby maximizing the device geometry of the transistor device to be formed in the N type region 16. The opening formed in the dielectric masking layer 30 is done by usual photolithographic masking and etching techniques. The P type region 32 can, if desired, be formed by ion implantation techniques.

In step 9, another masking layer 34 is formed using conventional oxide growth techniques such as the thermal growth of silicon dioxide on the surface of the integrated semiconductor structure. An opening is formed in the silicon dioxide masking layer 34 by conventional photolithographic and etching techniques and, subsequently, an N+ emitter region 36 is formed in the P type base region 32. As can be seen by reference to step 9 of FIG. 1, the N+ region 36 extends into contact with three of the four sidewalls of the dielectric layer 22. The reason the N+ region 36 does not extend across the entire P type region 32 is that room is needed for the formation of a contact to the P type region from the top surface of the integrated semiconductor structure as can be seen with respect to FIG. 2.

Figure 2:
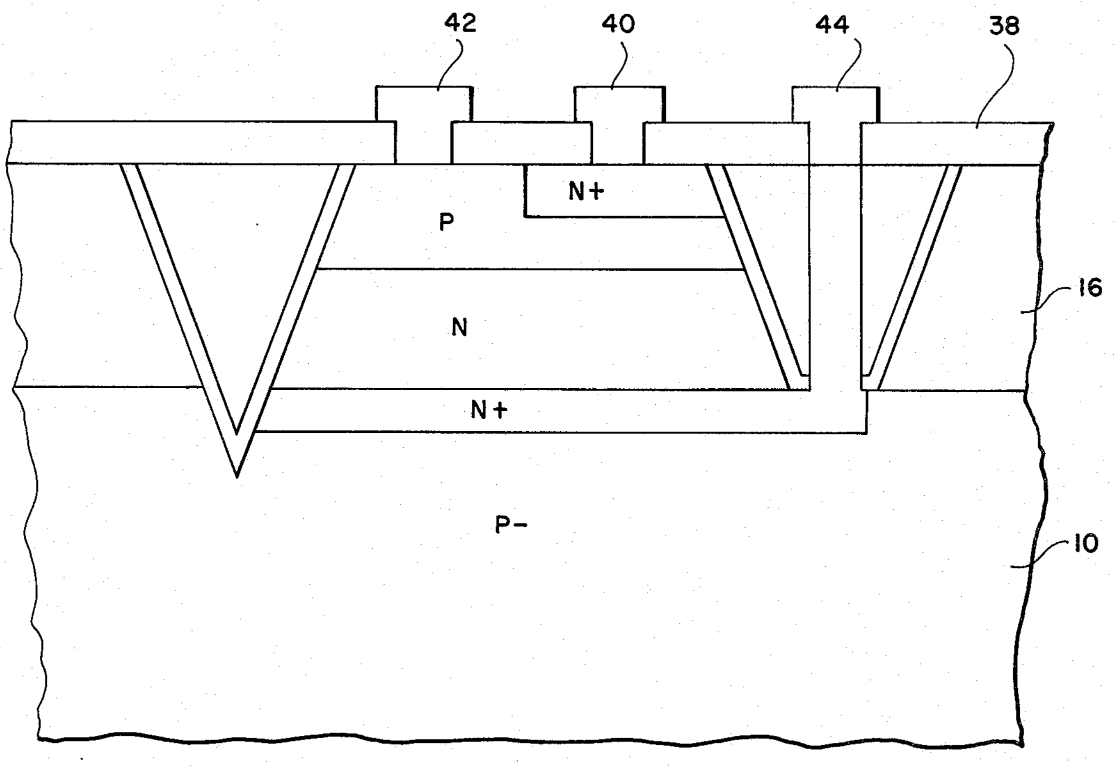
FIG. 2 is a view similar to step 9 of FIG. 1 with the metal contacts made to the emitter, base, and epitaxial highly doped semiconductor region that is in contact with the subcollector region of the transistor device.

Referring to FIG. 2, the identical structure shown in step 9 of FIG. 1 is shown with the addition of metallic contacts made to the emitter, base, and collector (sub-collector) region of the semiconductor transistor device. A metal contact 40 is formed to the N+ emitter region 36, a metal contact 42 is formed to the P type base region 32, and a metal contact 44 is formed to the N+ epitaxial region 26 which is an extension of the buried sub-collector region 12 that lies underneath the collector region of the semiconductor transistor device of this invention.

While the invention has been particularly shown and described in reference to the preferred embodiments thereof, it will be understood by those skilled in the art that changes in form and details may be made therein without departing from the spirit and scope of the invention.

I claim:

1. An integrated semiconductor structure comprising a body of semiconductor material having at least one semiconductor transistor device formed therein having an emitter region, a base region and a buried sub-collector region in said body of semiconductor material; a groove having sidewalls formed in said body of semiconductor material and surrounding said semiconductor transistor device; dielectric isolation means on the sidewalls of said groove for insulating said semiconductor transistor device from the remainder of said integrated semiconductor structure; polycrystalline semiconductor material in said groove; and a body of high conductivity monocrystalline semiconductor material of the same conductivity type as said buried sub-collector region extending through said groove within and contiguous with said polycrystalline semiconductor material said body of high conductivity monocrystalline semiconductor material passing through said dielectric isolation means to and to contact said buried sub-collector region.

2. The structure of claim 1 wherein said body of semiconductor material is of opposite conductivity to the conductivity of said buried sub-collector region of said semiconductor transistor device and forms a P-N junction therewith, said PN junction isolating said semiconductor transistor device from the remaining portion of said integrated semiconductor structure.

3. The structure of claim 2 wherein said semiconductor transistor device is an NPN transistor device.

4. The structure of claim 2 wherein said dielectric isolation means comprises a layer of silicon dioxide.

5. The structure of claim 4 wherein said polycrystalline semiconductor material comprises polycrystalline silicon material, said high conductivity body of monocrystalline semiconductor material being in contact with said polycrystalline silicon material.

6. The structure of claim 5 wherein said moat having a substantially V-shaped cross sectional configuration.

7. The structure of claim 1 wherein the entire perimeter of the base region of said semiconductor transistor device being in contact with said dielectric isolation means; the emitter region of said semiconductor transistor device being in contact with said dielectric sidewall isolation means.

8. The structure of claim 1 including separate metal contacts to the emitter region, the base region, and the high conductivity body that is in contact with said buried sub-collector region.

* * * * *